(12) United States Patent
Im et al.

(10) Patent No.: US 10,454,060 B2
(45) Date of Patent: Oct. 22, 2019

(54) METHOD OF MANUFACTURING AN ORGANIC LIGHT EMITTING DISPLAY DEVICE HAVING A HOLLOW SPACE FORMED BETWEEN A PORTION OF FIRST AND THIRD CONTACT ELECTRODES UNDER A PROTECTIVE ELECTRODE

(71) Applicant: LG Display Co., Ltd., Seoul (KR)

(72) Inventors: Jonghyeok Im, Busan (KR); JaeSung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/013,840

(22) Filed: Jun. 20, 2018

(65) Prior Publication Data

US 2018/0315950 A1    Nov. 1, 2018

Related U.S. Application Data

(62) Division of application No. 15/146,679, filed on May 4, 2016, now Pat. No. 10,050,223.

(30) Foreign Application Priority Data

Aug. 31, 2015  (KR) ......................... 10-2015-0123257

(51) Int. Cl.
*H01L 51/56*    (2006.01)
*H01L 51/52*    (2006.01)
(Continued)

(52) U.S. Cl.
CPC ...... *H01L 51/5228* (2013.01); *H01L 27/3246* (2013.01); *H01L 27/3248* (2013.01); *H01L 27/3272* (2013.01); *H01L 51/0023* (2013.01); *H01L 51/5212* (2013.01); *H01L 51/5234* (2013.01); *H01L 51/56* (2013.01); *H01L 51/5218* (2013.01); *H01L 2227/323* (2013.01);
(Continued)

(58) Field of Classification Search
CPC ............. H01L 51/0023; H01L 51/5212; H01L 51/5228; H01L 51/56
See application file for complete search history.

(56) References Cited

U.S. PATENT DOCUMENTS 9,553,156 B2    1/2017  Kim et al.
2010/0244664 A1  9/2010  Fujioka et al.
(Continued)

OTHER PUBLICATIONS

United States Office Action, U.S. Appl. No. 15/146,679, dated Dec. 15, 2017, 15 pages.
(Continued)

*Primary Examiner* — Anh D Mai
(74) *Attorney, Agent, or Firm* — Fenwick & West LLP

(57) ABSTRACT

Disclosed is an organic light emitting display device that may include an anode electrode; an organic emitting layer on the anode electrode; a cathode electrode on the organic emitting layer; an auxiliary electrode electrically connected with the cathode electrode; and a contact electrode that is on a same layer as the auxiliary electrode, the contact electrode horizontally spaced apart from the auxiliary electrode, the contact electrode directly connected with both the auxiliary electrode and the cathode electrode to connect together the auxiliary electrode and a portion of the cathode electrode that is on a same layer as the auxiliary electrode.

5 Claims, 8 Drawing Sheets

(51) Int. Cl.
    *H01L 27/32*      (2006.01)
    *H01L 51/00*      (2006.01)

(52) U.S. Cl.
    CPC ............... *H01L 2251/308* (2013.01); *H01L 2251/5315* (2013.01)

(56) References Cited

U.S. PATENT DOCUMENTS

| | | |
|---|---|---|
| 2011/0084257 A1 | 4/2011 | Kwon et al. |
| 2014/0183479 A1 | 7/2014 | Park et al. |
| 2014/0312323 A1 | 10/2014 | Park et al. |
| 2015/0097171 A1 | 4/2015 | Kim et al. |
| 2016/0013438 A1 | 1/2016 | Im et al. |
| 2016/0043341 A1 | 2/2016 | Heo et al. |
| 2016/0149155 A1 | 5/2016 | Kim |
| 2016/0293888 A1 | 10/2016 | Shim et al. |
| 2017/0133620 A1 | 5/2017 | Lee et al. |
| 2017/0141176 A1 | 5/2017 | Im et al. |
| 2017/0162834 A1 | 6/2017 | Kim et al. |
| 2017/0170246 A1 | 6/2017 | Im et al. |
| 2017/0170431 A1 | 6/2017 | Im et al. |
| 2017/0179208 A1 | 6/2017 | Jang et al. |
| 2017/0186831 A1 | 6/2017 | Nam et al. |
| 2017/0317154 A1 | 11/2017 | Heo |
| 2018/0097047 A1 | 4/2018 | Jung et al. |
| 2018/0120620 A1* | 5/2018 | Shim .................. H01L 51/5228 |
| 2018/0122877 A1* | 5/2018 | Beak .................... H01L 51/56 |
| 2018/0123078 A1 | 5/2018 | Byun et al. |
| 2018/0151647 A1* | 5/2018 | Lee .................. H01L 21/02008 |
| 2018/0151831 A1* | 5/2018 | Lee .................... H01L 27/3223 |
| 2018/0190934 A1* | 7/2018 | Choi .................. H01L 51/5228 |
| 2018/0366533 A1* | 12/2018 | Lee .................... H01L 51/5228 |

OTHER PUBLICATIONS

United States Office Action, U.S. Appl. No. 15/146,679, dated Jul. 13, 2017, 13 pages.

\* cited by examiner

METHOD OF MANUFACTURING AN ORGANIC LIGHT EMITTING DISPLAY DEVICE HAVING A HOLLOW SPACE FORMED BETWEEN A PORTION OF FIRST AND THIRD CONTACT ELECTRODES UNDER A PROTECTIVE ELECTRODE

CROSS REFERENCE TO RELATED APPLICATIONS

This application is a divisional of U.S. patent application Ser. No. 15/146,679, filed on May 4, 2016 which claims the benefit of Korean Patent Application No. 10-2015-0123257 filed on Aug. 31, 2015, each of which is hereby incorporated by reference as if fully set forth herein.

BACKGROUND

Field of the Disclosure

Embodiments of the present disclosure relate to an organic light emitting display device, and more particularly, to a top emission type organic light emitting display device, and a method of manufacturing the same.

Discussion of the Related Art

An organic light emitting display (OLED) device, which is a self light emitting display device, has advantages of low power consumption, rapid response speed, high emission efficiency, high luminance and wide viewing angle.

According to a direction of light emitted from an organic light emitting device, the OLED device may be largely classified into a top emission type and a bottom emission type. In case of the bottom emission type, a circuit device is disposed between an emitting layer and an image displaying surface, whereby an aperture ratio may be lowered due to the circuit device. Meanwhile, in case of the top emission type, a circuit device is not disposed between an emitting layer and an image displaying surface, whereby an aperture ratio may be improved.

FIG. 1 is a cross sectional view of a related art top emission type OLED device.

As shown in FIG. 1, a thin film transistor layer (T) including an active layer 11, a gate insulating film 12, a gate electrode 13, an insulating interlayer 14, a source electrode 15, and a drain electrode 16 is provided on a substrate 10, and then a passivation layer 20 and a planarization layer 30 are sequentially provided on the thin film transistor layer (T).

Also, an anode electrode 40 and an auxiliary electrode 50 are provided on the planarization layer 30. The auxiliary electrode 50 is provided to reduce a resistance of a cathode electrode 80 to be explained later.

On the anode electrode 40 and the auxiliary electrode 50, a bank 60 is provided to define a pixel region. Also, an organic emitting layer 70 is provided in the pixel region defined by the bank 60, and the cathode electrode 80 is provided on the organic emitting layer 70.

In case of the top emission type, a light emitted from the organic emitting layer 70 passes through the cathode electrode 80. In this reason, the cathode electrode 80 is formed of a transparent conductive material, which causes the increase of resistance therein. In order to reduce the resistance of the cathode electrode 80, the cathode electrode 80 is connected with the auxiliary electrode 50.

In order to connect the cathode electrode 80 with the auxiliary electrode 50, an upper surface of the auxiliary electrode 50 is not covered by the organic emitting layer 70. That is, after forming the organic emitting layer 70, the upper surface of the auxiliary electrode 50 is exposed so that the cathode electrode 80 is connected with the upper surface of the auxiliary electrode 50. In order to prevent the upper surface of the auxiliary electrode 50 from being covered by the organic emitting layer 70, a partition 65 with a reversed tapered structure is provided in the upper surface of the auxiliary electrode 50.

Owing to the partition 65 with the reversed tapered structure, a space is provided between the bank 60 and the partition 65. In this case, the partition 65 with the reversed tapered structure serves as eaves, whereby the organic emitting layer 70 is not deposited in the space. That is, the organic emitting layer 70 may be manufactured by a deposition process using a deposition material with superior straightness, for example, evaporation. Thus, for the deposition process of the organic emitting layer 70, the partition 65 serves as the eaves so that it is possible to prevent the organic emitting layer 70 from being deposited in the space between the bank 60 and the partition 65.

Meanwhile, the cathode electrode 80 may be manufactured by a deposition process using a deposition material with inferior straightness, for example, sputtering. Thus, for the deposition process of the cathode electrode 80, the cathode electrode 80 may be deposited in the space between the bank 60 and the partition 65 so that the cathode electrode 80 may be electrically connected with the auxiliary electrode 50.

However, since the related art top emission type organic light emitting display device necessarily includes the partition 65 with the reversed tapered structure, it may have the following problems.

In order to pattern the partition 65 with the reversed tapered structure, it is necessary to carry out a PEB (Post Exposure Bake) process. However, it is difficult to control the PEB process to obtain the desired reversed tapered structure. If the desired reversed tapered structure is not created, the partition 65 may collapse or peel off. In this case, an electrical connection between the cathode electrode 80 and the auxiliary electrode 50 may be difficult.

SUMMARY

Accordingly, embodiments of the present disclosure are directed to a top emission type organic light emitting display device that substantially obviates one or more problems due to limitations and disadvantages of the related art.

An aspect of embodiments of the present disclosure is directed to provide a top emission type organic light emitting display device which facilitates an electrical connection between a cathode electrode and an auxiliary electrode without a partition having a reversed tapered structure.

Additional advantages and features of embodiments of the disclosure will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the disclosure, as embodied and broadly described herein, there is provided an organic light emitting display device that may include an anode electrode on a substrate; an organic emitting layer on the anode electrode; a cathode electrode on the organic emitting layer; an auxiliary electrode electrically connected with the cathode electrode; and a contact electrode that is on a same layer as the auxiliary electrode, the contact electrode horizontally spaced apart from the auxiliary electrode, the contact electrode directly connected with both the auxiliary electrode and the cathode electrode to connect together the auxiliary electrode and a portion of the cathode electrode that is on a same layer as the auxiliary electrode.

In another aspect of embodiments of the present disclosure, there is provided a method of manufacturing an organic light emitting display device that may include forming a contact electrode over a substrate, the contact electrode including a first contact electrode, a second contact electrode on the first contact electrode, and a third contact electrode on the second contact electrode, the first contact electrode formed with an end that horizontally extends past an end of the third contact electrode; forming a planarization layer over the contact electrode, the planarization layer including a contact hole that exposes the contact electrode; forming a protection electrode on the planarization layer, the protection electrode connected to the contact electrode via the contact hole in the planarization layer; forming a bank that overlaps a portion of the protection electrode, a portion of the first contact electrode, a portion of the second contact electrode, and the end of the third contact electrode; etching a portion of the protection electrode and a portion of the second contact electrode that are not overlapped by the bank to create a hollow space between the portion of the second contact electrode and the portion of the first contact electrode that are overlapped by the bank; and forming a cathode electrode which extends to the hollow space and is connected to the first contact electrode at the hollow space.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the present disclosure and together with the description serve to explain the principle of embodiments of the invention. In the drawings.

DETAILED DESCRIPTION

Figure 1:
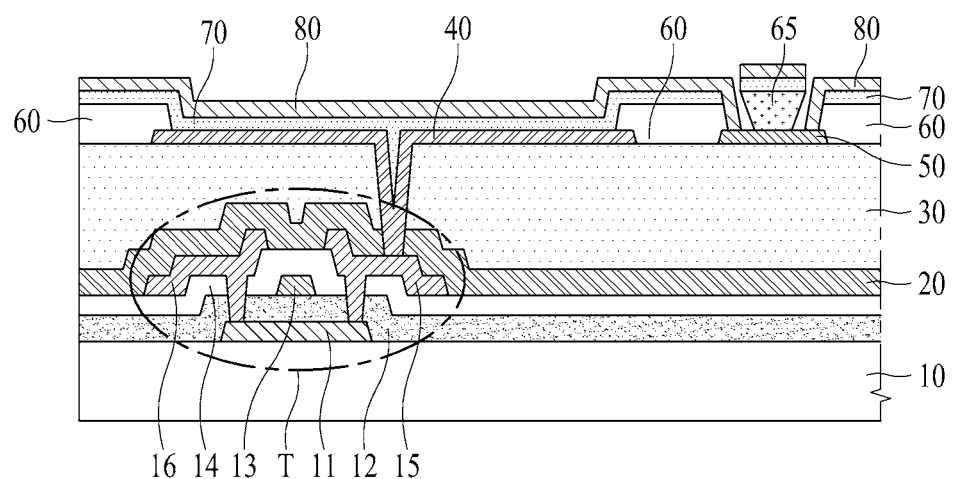
FIG. 1 is a cross sectional view illustrating a related art top emission type organic light emitting display device.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary. In construing an element, the element is construed as including an error region although there is no explicit description.

In description of embodiments of the present disclosure, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed there between.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting display device according to embodiments of the present invention will be described in detail with reference to the accompanying drawings.

Figure 2:
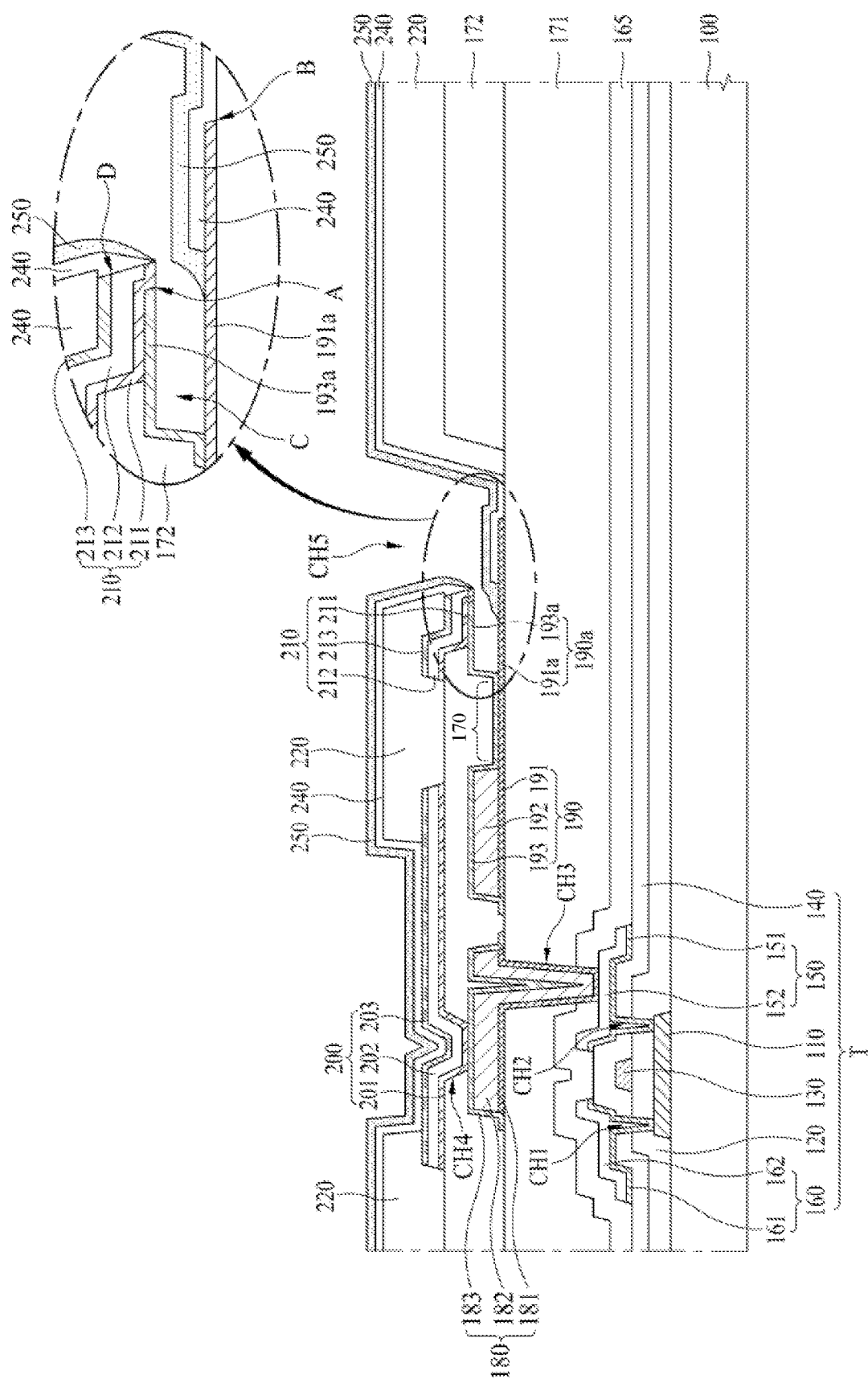
FIG. 2 is a cross sectional view illustrating an organic light emitting display device according to one embodiment of the present disclosure.

FIG. 2 is a cross sectional view illustrating an organic light emitting display device according to one embodiment of the present disclosure.

As shown in FIG. 2, the organic light emitting display device according to one embodiment of the present disclosure may include a substrate 100, a thin film transistor layer (T), a passivation layer 165, a first planarization layer 171, a second planarization layer 172, a first anode electrode 180, a second anode electrode 200, an auxiliary electrode 190, a contact electrode 190a, a protection electrode 210, a bank 220, an organic emitting layer 240 and a cathode electrode 250.

The substrate 100 may be formed of glass or transparent plastic.

The thin film transistor layer (T) may include an active layer 110, a gate insulating film 120, a gate electrode 130, an insulating interlayer 140, a source electrode 150 and a drain electrode 160.

The active layer 110 is provided on the substrate 100, wherein the active layer 110 overlaps with the gate electrode 130. The active layer 110 may be formed a silicon-based semiconductor material or oxide-based semiconductor material. Although not shown, a light shielding layer may be additionally provided between the substrate 100 and the active layer 110. In this case, an external light, which is incident on a lower surface of the substrate 100, is blocked by the light shielding layer so that it is possible to prevent the active layer 110 from being damaged by the external light.

The gate insulating film 120 is provided on the active layer 110. The gate insulating film 120 insulates the active layer 110 and the gate electrode 130 from each other. For example, the gate insulating film 120 may be formed of an inorganic insulating material, and more particularly, the gate insulating film 120 may be formed in a single-layered structure of the inorganic insulating material such as silicon oxide SiOx or silicon nitride SiNx, or a multi-layered structure of the above silicon oxide SiOx and silicon nitride SiNx, but not limited to these structures.

The gate electrode 130 is provided on the gate insulating film 120. The gate electrode 130 overlaps with the active layer 110, and the gate insulating film 120 is interposed between the gate electrode 130 and the active layer 110 being overlapped with each other. The gate electrode 130 may be formed in a single-layered structure or multi-layered structure including molybdenum (Mo), aluminum (Al), chrome (Cr), aurum (Au), titanium (Ti), nickel (Ni), neodymium (Nd), copper (Cu) and their alloys, but not limited to these materials.

The insulating interlayer 140 is provided on the gate electrode 130. The insulating interlayer 140 is formed of the same material as that of the gate insulating film 120. For example, the insulating interlayer 140 may be formed in a single-layered structure of the inorganic insulating material such as silicon oxide SiOx or silicon nitride SiNx, or a multi-layered structure of the above silicon oxide SiOx, silicon nitride SiNx and their alloys, but not limited to these materials.

The source electrode 150 and the drain electrode 160 confronting each other are provided on the insulating interlayer 140. A first contact hole (CH1) for exposing one end portion of the active layer 110 is provided in the aforementioned gate insulating film 120 and the insulating interlayer 140, and a second contact hole (CH2) for exposing the other end portion of the active layer 110 is provided in the aforementioned gate insulating film 120 and the insulating interlayer 140. The source electrode 150 is connected with the other end portion of the active layer 110 via the second contact hole (CH2), and the drain electrode 160 is connected with one end portion of the active layer 110 via the first contact hole (CH1).

The source electrode 150 may include a lower source electrode 151 and an upper source electrode 152.

The lower source electrode 151 is provided between the insulating interlayer 140 and the upper source electrode 152, wherein the lower source electrode 151 enhances an adhesive strength between the insulating interlayer 140 and the upper source electrode 152. Also, the lower source electrode 151 protects a lower surface of the upper source electrode 152 so that it is possible to prevent the lower surface of the upper source electrode 152 from being corroded. Thus, an oxidation degree of the lower source electrode 151 may be lower than an oxidation degree of the upper source electrode 152. That is, a corrosion resistance in a material of the lower source electrode 151 may be superior to a corrosion resistance in a material of the upper source electrode 152. The lower source electrode 151 functions as an adhesion enhancement layer or a corrosion preventing layer. The lower source electrode 151 may be formed of an alloy MoTi of molybdenum and titanium, but not limited to this material.

The upper source electrode 152 is provided on an upper surface of the lower source electrode 151. The upper source electrode 152 may be formed of a low-resistance metal material such as copper Cu, but not limited to this metal material. The upper source electrode 152 may be formed of a metal material whose resistance is relatively lower than that of the lower source electrode 151. In order to lower a total resistance of the source electrode 150, a thickness of the upper source electrode 152 may be larger than a thickness of the lower source electrode 151, preferably.

In the same way as the aforementioned source electrode 150, the drain electrode 160 may include a lower drain electrode 161 and an upper drain electrode 162.

The lower drain electrode 161 is provided between the insulating interlayer 140 and the upper drain electrode 162, wherein the lower drain electrode 161 enhances an adhesive strength between the insulating interlayer 140 and the upper drain electrode 162. Also, the lower drain electrode 161 prevents a lower surface of the upper drain electrode 162 from being corroded. Thus, an oxidation degree of the lower drain electrode 161 may be lower than an oxidation degree of the upper drain electrode 162. That is, a corrosion resistance in a material of the lower drain electrode 161 may be superior to a corrosion resistance in a material of the upper drain electrode 162. The lower drain electrode 161 may be formed of an alloy MoTi of molybdenum and titanium, but not limited to this material.

The upper drain electrode 162 is provided on an upper surface of the lower drain electrode 161. The upper drain electrode 162 may be formed of the same material as that of the aforementioned upper source electrode 152, for example, copper Cu, but not limited to this material. In order to lower a total resistance of the drain electrode 160, a thickness of the upper drain electrode 162 may be larger than a thickness of the lower drain electrode 161, preferably.

The upper drain electrode 162 may be formed of the same material as that of the upper source electrode 152, and the upper drain electrode 162 may be formed in the same thickness as that of the upper source electrode 152. The lower drain electrode 161 may be formed of the same material as that of the lower source electrode 151, and the lower drain electrode 161 may be formed in the same thickness as that of the lower source electrode 151. In this case, the drain electrode 160 and the source electrode 150 may be simultaneously manufactured in the same process.

A structure of the thin film transistor layer (T) is not limited to the above structure, that is, a structure of the thin film transistor layer (T) may be changed to various shapes generally known to those in the art. For example, the drawing shows a top gate structure where the gate electrode 130 is provided on the active layer 110, but not necessarily.

That is, it is possible to provide a bottom gate structure where the gate electrode 130 is provided below the active layer 110.

The passivation layer 165 is provided on the thin film transistor layer (T), and more particularly, on upper surfaces of the source electrode 150 and the drain electrode 160. The passivation layer 165 protects the thin film transistor layer (T). The passivation layer 165 may be formed of an inorganic insulating material, for example, silicon oxide film SiOx or silicon nitride film SiNx, but not limited to these materials.

The first planarization layer 171 is provided on the passivation layer 165. The first planarization layer 171 is provided to planarize an upper surface of the substrate 100 with the thin film transistor layer (T). The first planarization layer 171 may be formed of an organic insulating material, for example, acryl resin, epoxy resin, phenolic resin, polyamide resin, polyimide resin, and etc., but not limited to these materials.

The first anode electrode 180 and the auxiliary electrode 190 are provided on the first planarization layer 171. That is, the first anode electrode 180 and the auxiliary electrode 190 are disposed in the same layer. A third contact hole (CH3) for exposing the source electrode 150 is provided in the aforementioned passivation layer 165 and the first planarization layer 171. The source electrode 150 and the first anode electrode 180 are connected with each other via the third contact hole (CH3).

The first anode electrode 180 may include a first lower anode electrode 181, a first upper anode electrode 182 and a first cover anode electrode 183.

The first lower anode electrode 181 is provided between the planarization layer 170 and the first upper anode electrode 182, wherein the first lower anode electrode 181 enhances an adhesive strength between the planarization layer 170 and the first upper anode electrode 182. Also, the first lower anode electrode 181 protects a lower surface of the first upper anode electrode 182 so that it is possible to prevent the lower surface of the first upper anode electrode 182 from being corroded. Thus, an oxidation degree of the first lower anode electrode 181 may be lower than an oxidation degree of the first upper anode electrode 182. That is, a corrosion resistance in a material of the first lower anode electrode 181 may be superior to a corrosion resistance in a material of the first upper anode electrode 182. Also, the first lower anode electrode 181 protects an upper surface of the upper source electrode 152 so that it is possible to prevent the upper surface of the upper source electrode 152 from being corroded. Thus, an oxidation degree of the first lower anode electrode 181 may be lower than an oxidation degree of the upper source electrode 152. That is, a corrosion resistance in a material of the first lower anode electrode 181 may be superior to a corrosion resistance in a material of the upper source electrode 152. The first lower anode electrode 181 prevents the upper surface of the upper source electrode 152 from being corroded so that it is possible to provide the aforementioned dual-layered structure in the source electrode 150. The first lower anode electrode 181 functions as an adhesion enhancement layer or a corrosion preventing layer. The first lower anode electrode 181 may be formed of indium-tin-oxide (ITO), but not limited to this material.

The first upper anode electrode 182 is provided between the first lower anode electrode 181 and the first cover anode electrode 183. The first upper anode electrode 182 may be formed of a low-resistance metal material such as copper Cu, but not limited to this metal material. The first upper anode electrode 182 may be formed of a metal material whose resistance is relatively lower than that in each of the first lower anode electrode 181 and the first cover anode electrode 183. In order to lower a total resistance of the first anode electrode 180, a thickness of the first upper anode electrode 182 may be larger than a thickness in each of the first lower anode electrode 181 and the first cover anode electrode 183, preferably.

The first cover anode electrode 183 is provided on the first upper anode electrode 182. The first cover anode electrode 183 covers upper and lateral surfaces of the first upper anode electrode 182 so that the first cover anode electrode 183 prevents the first upper anode electrode 182 from being corroded. Thus, an oxidation degree of the first cover anode electrode 183 may be lower than an oxidation degree of the first upper anode electrode 182. That is, a corrosion resistance in a material of the first cover anode electrode 183 may be superior to a corrosion resistance in a material of the first upper anode electrode 182. The first cover anode electrode 183 also covers lateral surfaces of the first lower anode electrode 181. The first cover anode electrode 183 may be formed of a transparent conductive material such as indium-tin-oxide (ITO), but not limited to this material.

The auxiliary electrode 190 is spaced apart from the first anode electrode 180. In the same way as the aforementioned first anode electrode 180, the auxiliary electrode 190 may include a lower auxiliary electrode 191, an upper auxiliary electrode 192 and a cover auxiliary electrode 193.

The lower auxiliary electrode 191 is provided between the planarization layer 170 and the upper auxiliary electrode 192, wherein the lower auxiliary electrode 191 enhances an adhesive strength between the planarization layer 170 and the upper auxiliary electrode 192, and also prevents a lower surface of the upper auxiliary electrode 192 from being corroded. Thus, an oxidation degree of the lower auxiliary electrode 191 may be lower than an oxidation degree of the upper auxiliary electrode 192. That is, a corrosion resistance in a material of the lower auxiliary electrode 191 may be superior to a corrosion resistance in a material of the upper auxiliary electrode 192. The lower auxiliary electrode 191 may be formed of the same material as that of the aforementioned first lower anode electrode 181, that is, indium-tin-oxide (ITO), but not limited to this material.

The upper auxiliary electrode 192 is provided between the lower auxiliary electrode 191 and the cover auxiliary electrode 193. The upper auxiliary electrode 192 may be formed of the same material as that of the aforementioned first upper anode electrode 182, that is, copper Cu, but not limited to this material. In order to lower a total resistance of the auxiliary electrode 190, a thickness of the upper auxiliary electrode 192 with a relatively low resistance may be larger than a thickness of each of the lower auxiliary electrode 191 and the cover auxiliary electrode 193 with a relatively high resistance, preferably.

The cover auxiliary electrode 193 is provided on the upper auxiliary electrode 192. The cover auxiliary electrode 193 covers upper and lateral (e.g., side) surfaces of the upper auxiliary electrode 192 so that the cover auxiliary electrode 193 prevents the upper auxiliary electrode 192 from being corroded. Thus, an oxidation degree of the cover auxiliary electrode 193 may be lower than an oxidation degree of the upper auxiliary electrode 192. That is, a corrosion resistance in a material of the cover auxiliary electrode 193 may be superior to a corrosion resistance in a material of the upper auxiliary electrode 192. The cover auxiliary electrode 193 also covers lateral surfaces of the lower auxiliary electrode 191. The cover auxiliary electrode 193 may be formed of a transparent conductive material such as indium-tin-oxide (ITO), but not limited to this material.

The cover auxiliary electrode 193 may be formed of the same material as that of the first cover anode electrode 183, and the cover auxiliary electrode 193 may be formed in the same thickness as that of the first cover anode electrode 183. The upper auxiliary electrode 192 may be formed of the same material as that of the first upper anode electrode 182, and the upper auxiliary electrode 192 may be formed in the same thickness as that of the first upper anode electrode 182. The lower auxiliary electrode 191 may be formed of the same material as that of the first lower anode electrode 181, and the lower auxiliary electrode 191 may be formed in the same thickness as that of the first lower anode electrode 181. In this case, the auxiliary electrode 190 and the first anode electrode 180 may be simultaneously manufactured in the same process.

According to one embodiment of the present disclosure, the auxiliary electrode 190 is provided in the same layer as the first anode electrode 180 instead of the second anode electrode 200 so that it is possible to efficiently lower the resistance of the cathode electrode 250 without decreasing a pixel region. In detail, if the auxiliary electrode 190 is formed in the same layer as the second anode electrode 200, the auxiliary electrode 190 is increased in size so as to lower the resistance of the cathode electrode 250, and thus the second anode electrode 200 is decreased in size, thereby decreasing the pixel region.

Meanwhile, according to one embodiment of the present disclosure, if the auxiliary electrode 190 is formed in the same layer as the first anode electrode 180, the auxiliary electrode 190 is increased in size so as to lower the resistance of the cathode electrode 250. In this case, even though the first anode electrode 180 is decreased in size, the pixel region is not decreased. That is, the first anode electrode 180 connects the source electrode 150 and the second anode electrode 200 with each other. Thus, even though the first anode electrode 180 is decreased in width, the pixel region is not decreased. The pixel region depends on the second anode electrode 200.

According to one embodiment of the present disclosure, it is possible to increase a width of the auxiliary electrode 190 without decreasing the pixel region. In detail, as shown in the drawings, the width of the auxiliary electrode 190 is increased so as to overlap the auxiliary electrode 190 with the second anode electrode 200 so that it is possible to efficiently lower the resistance of the cathode electrode 250.

In the same manner as the first anode electrode 180 and the auxiliary electrode 190, the contact electrode 190*a* is provided on the first planarization layer 171. That is, the contact electrode 190*a* is provided in the same layer as the first anode electrode 180 and the auxiliary electrode 190.

The contact electrode 190*a* connects the auxiliary electrode 190 with the cathode electrode 250. Thus, the contact electrode 190*a* is electrically connected with the auxiliary electrode 190, and is also electrically connected with the cathode electrode 250. Especially, the contact electrode 190*a* is directly connected with the auxiliary electrode 190 and the cathode electrode 250.

The contact electrode 190*a* may include a lower contact electrode 191*a* and a cover contact electrode 193*a*.

The lower contact electrode 191*a* is provided on the planarization layer 170. The lower contact electrode 191*a* is directly connected with the lower auxiliary electrode 191. Especially, the lower contact electrode 191*a* may be formed of the same material as that of the lower auxiliary electrode 191, and may be formed in the same thickness as that of the lower auxiliary electrode 191 as one body. In this case, the lower contact electrode 191*a* and the lower auxiliary electrode 191 may be simultaneously manufactured in the same process. Also, the lower contact electrode 191*a* may be directly connected with the cathode electrode 250. In more detail, the cathode electrode 250 is brought into contact with the upper surface of the lower contact electrode 191*a*.

The cover contact electrode 193*a* is provided on the lower contact electrode 191*a*. The cover contact electrode 193*a* is connected with the lower contact electrode 191*a*, and is also connected with the cover auxiliary electrode 193. Especially, the cover contact electrode 193*a* may be formed of the same material as that of the cover auxiliary electrode 193, and may be formed in the same thickness as that of the cover auxiliary electrode 193 as one body. In this case, the cover contact electrode 193*a* and the cover auxiliary electrode 193 may be simultaneously manufactured in the same process. The contact electrode 190*a* and the auxiliary electrode 190 may be horizontally spaced apart from each other are connected to each other via an intermediate electrode 170.

An end (A) of the cover contact electrode 193*a*, which does not confront the auxiliary electrode 190, is provided at a predetermined interval from an end (B) of the lower contact electrode 191*a* which does not confront the auxiliary electrode 190, whereby a hollow space (C) is prepared between the cover contact electrode 193*a* and the lower contact electrode 191*a*. In the hollow space (C), the lower contact electrode 191*a* and the cathode electrode 250 are connected with each other. In order to prepare the hollow space (C), the end (B) of the lower contact electrode 191*a* extends more than the end (A) of the cover contact electrode 193*a*, preferably. This is for an easy permeation of an etchant into the space between the cover contact electrode 193*a* and the lower contact electrode 191*a* for the following process of FIG. 3H to be explained later.

The lower contact electrode 191*a* and the cover contact electrode 193*a* may be formed of a material which is not etched by an etchant capable of etching a material for the upper auxiliary electrode 192, for example, crystalline indium-tin-oxide (ITO).

The second planarization layer 172 is provided on the first anode electrode 180, the auxiliary electrode 190 and the contact electrode 190*a*. The second planarization layer 172 together with the aforementioned first planarization layer 171 planarizes the upper surface of the substrate 100. The second planarization layer 172 may be formed of an organic insulating material, for example, acryl resin, epoxy resin, phenolic resin, polyamide resin, polyimide resin, and etc., but not limited to these materials.

A fourth contact hole (CH4) and a fifth contact hole (CH5) are provided in the second planarization layer 172. The first anode electrode 180 is exposed via the fourth contact hole (CH4), and the contact electrode 190*a* is exposed via the fifth contact hole (CH5). The fifth contact hole (CH5) is in contact with the hollow space (C), whereby the cathode electrode 250 may extend to the hollow space (C) via the fifth contact hole (CH5), and thus the cathode electrode 250 may be connected with the contact electrode 190*a* in the hollow space (C).

The second anode electrode 200 is provided on the second planarization layer 172. The second anode electrode 200 is connected with the first anode electrode 180 via the fourth contact hole (CH4). The second anode electrode 200 reflects a light emitted from the organic emitting layer 240 to an upper direction. In this reason, the second anode electrode 200 includes a material with good reflectance. The second anode electrode 200 may include a second lower anode electrode 201, a second central anode electrode 202 and a second upper anode electrode 203.

The second lower anode electrode 201 is provided between the first anode electrode 180 and the second central anode electrode 202. The second lower anode electrode 201 protects a lower surface of the second central anode electrode 202 so that it is possible to prevent the lower surface of the second central anode electrode 202 from being corroded. Thus, an oxidation degree of the second lower anode electrode 201 may be lower than an oxidation degree of the second central anode electrode 202. That is, a corrosion resistance in a material of the second lower anode electrode 201 may be superior to a corrosion resistance in a material of the second central anode electrode 202. The second lower anode electrode 201 may be formed of a transparent conductive material such as indium-tin-oxide (ITO) or indium-zinc-oxide (IZO), but not limited to these materials.

The second central anode electrode 202 is provided between the second lower anode electrode 201 and the second upper anode electrode 203. The second central anode electrode 202 may be formed of a material with relatively-low resistance and relatively-high reflectance in comparison to the second lower anode electrode 201 and the second upper anode electrode 203, for example, argentums Ag, but not limited to this material. In order to lower a total resistance of the second anode electrode 200, a thickness of the second central anode electrode 202 with relatively-low resistance may be larger than a thickness in each of the second lower anode electrode 201 and the second upper anode electrode 203 with relatively-high resistance, preferably.

The second upper anode electrode 203 is provided on an upper surface of the second central anode electrode 202 so that it is possible to prevent the upper surface of the second central anode electrode 202 from being corroded. Thus, an oxidation degree of the second upper anode electrode 203 may be lower than an oxidation degree of the second central anode electrode 202. That is, a corrosion resistance in a material of the second upper anode electrode 203 may be superior to a corrosion resistance in a material of the second central anode electrode 202. The second upper anode electrode 203 may be formed of a transparent conductive material such as indium-tin-oxide (ITO) or indium-zinc-oxide (IZO), but not limited to this material.

The protection electrode 210 is spaced apart from the second anode electrode 200. Like the second anode electrode 200, the protection electrode 210 is provided on the second planarization layer 172. The protection electrode 210 protects the contact electrode 190a. In detail, the protection electrode 210 is configured to prepare the hollow space (C) between the cover contact electrode 193a and the lower contact electrode 191a. To this end, the end (B) of the lower contact electrode 191a extends more than an end (D) of the protection electrode 210 which does not confront the second anode electrode 200, preferably. That is, the protection electrode 210 remains after the etching process in the process of FIG. 3H relating the following manufacturing process to be explained later. Thus, the end (B) of the lower contact electrode 191a extends more than the end (D) of the protection electrode 210, as shown in FIG. 2.

The protection electrode 210 is connected with the contact electrode 190a via the fifth contact hole (CH5) provided in the second planarization layer 172. Especially, the protection electrode 210 is brought into contact with the upper surface of the cover contact electrode 193a. The protection electrode 210 is electrically connected with the auxiliary electrode 190 and the contact electrode 190a so that it is possible to lower the resistance of the cathode electrode 250.

The protection electrode 210 may include a lower protection electrode 211, a central protection electrode 212 and an upper protection electrode 213.

The lower protection electrode 211 is provided between the contact electrode 190a and the central protection electrode 212. The lower protection electrode 211 protects a lower surface of the central protection electrode 212 so that the lower protection electrode 211 prevents the lower surface of the central protection electrode 212 from being corroded. Accordingly, an oxidation degree of the lower protection electrode 211 may be lower than an oxidation degree of the central protection electrode 212. That is, a corrosion resistance in a material of the lower protection electrode 211 may be superior to a corrosion resistance in a material of the central protection electrode 212. The lower protection electrode 211 may be formed of a transparent conductive material such as indium-tin-oxide (ITO) or indium-zinc-oxide (IZO), but not limited to this material. Preferably, the lower protection electrode 211 is formed of a material which is easily etched by the etchant capable of etching the material for the upper auxiliary electrode 192. Thus, the lower protection electrode 211 is formed of indium-zinc-oxide (IZO) which is higher than a crystallization temperature. This will be easily understood by the following description for the manufacturing process to be explained later.

The central protection electrode 212 is provided between the lower protection electrode 211 and the upper protection electrode 213. The central protection electrode 212 may be formed of a material with relatively-low resistance and relatively-high reflectance in comparison to the lower protection electrode 211 and the upper protection electrode 213, for example, argentums Ag, but not limited to this material. In order to lower a total resistance of the protection electrode 210, a thickness of the central protection electrode 212 with relatively-low resistance may be larger than a thickness in each of the lower protection electrode 211 and the upper protection electrode 213 with relatively-high resistance, preferably.

The upper protection electrode 213 is provided on an upper surface of the central protection electrode 212 so that it is possible to prevent the upper surface of the central protection electrode 212 from being corroded. Thus, an oxidation degree of the upper protection electrode 213 may be lower than an oxidation degree of the central protection electrode 212. That is, a corrosion resistance in a material of the upper protection electrode 213 may be superior to a corrosion resistance in a material of the central protection electrode 212. The upper protection electrode 213 may be formed of a transparent conductive material such as indium-tin-oxide (ITO) or indium-zinc-oxide (IZO), but not limited to this material. Like the aforementioned lower protection electrode 211, the upper protection electrode 213 is formed of a material which is easily etched by the etchant capable of etching the material for the upper auxiliary electrode 192, preferably. Thus, the upper protection electrode 213 is formed of indium-zinc-oxide IZO which has high crystallization temperature, preferably. This will be easily understood by the following description for the manufacturing process to be explained later.

The upper protection electrode 213 may be formed of the same material as that of the second upper anode electrode 203, and may be formed in the same thickness as that of the second upper anode electrode 203. The central protection electrode 212 may be formed of the same material as that of the second central anode electrode 202, and may be formed in the same thickness as that of the second central anode electrode 202. The lower protection electrode 211 may be formed of the same material as that of the second lower anode electrode 201, and may be formed in the same thickness as that of the second lower anode electrode 201. In this case, the protection electrode 210 and the second anode electrode 200 may be simultaneously manufactured in the same process.

The bank 220 is provided on the second anode electrode 200 and the protection electrode 210.

The bank 220, which exposes the upper surface of the second anode electrode 200, is provided on one side and the other side of the second anode electrode 200. According as the bank 220 is provided to expose the upper surface of the second anode electrode 200, it is possible to secure an image-displaying area. Also, the bank 220 is provided between the second anode electrode 200 and the protection electrode 210 so that the second anode electrode 200 and the protection electrode 210 are insulated from each other by the bank 220. The bank 220 may be formed of an organic insulating material, for example, polyimide resin, acryl resin, benzocyclobutene BCB, and etc., but not limited to these materials.

The bank 220 is patterned to cover the upper surface of the protection electrode 210. Thus, the protection electrode 210 covered by the bank 220 remains after the etching process. Also, the bank 220 is patterned to expose the contact electrode 190a, and more particularly, the lower contact electrode 191a. That is, the bank 220 is patterned to expose the lower contact electrode 191a via the aforementioned fifth contact hole (CH5).

A predetermined portion of the bank 220 extends to the fifth contact hole (CH5) along the lateral side of the second planarization layer 172, such that the bank 220 overlaps the protection electrode and the upper contact electrode 193a. If the predetermined portion of the bank 220 extends to the fifth contact hole (CH5), the cathode electrode 250 is easily connected with the lower contact electrode 191a along the upper surface of the extending bank 220. That is, as shown in the drawings, when the predetermined portion of the bank 220 extends to the fifth contact hole (CH5), the organic emitting layer 240 and the cathode electrode 250 are sequentially deposited on the upper surface of the extending bank 220. As a result, the cathode electrode 250 formed on the bank 220 located to the right of the contact hole CH5 is brought into contact with the upper surface of the lower contact electrode 191a which is exposed to the outside without being in contact with the bank 220. If the bank 220 to the left of the contact hole CH5 does not extend to the fifth contact hole (CH5), the cathode electrode 250 extending to the fifth contact hole (CH5) may not connect to the lower contact electrode 191a.

The organic emitting layer 240 is provided on the second anode electrode 200. The organic emitting layer 240 may include a hole injecting layer, a hole transporting layer, an emitting layer, an electron transporting layer and an electron injecting layer. A structure of the organic emitting layer 240 may be changed to various shapes generally known to those in the art.

The organic emitting layer 240 may extend to the upper surface of the bank 220. Also, the organic emitting layer 240 may extend to the fifth contact hole (CH5) along the upper surface of the bank 220 extending to the fifth contact hole (CH5), and then come in contact the predetermined portion of the upper surface of the lower contact electrode 191a. However, the organic emitting layer 240 does not extend into the inside of the hollow space (C) prepared between the cover contact electrode 193a and the lower contact electrode 191a. That is, the organic emitting layer 240 is provided to expose the upper surface of the lower contact electrode 191a positioned in the hollow space (C) so that the cathode electrode 250 is connected with the lower contact electrode 191a exposed in the hollow space (C).

The organic emitting layer 240 may be manufactured by an evaporation method using a deposition material with superior straightness. Thus, the organic emitting layer 240 is not deposited in the hollow space (C) since the bank 220 serves as the eaves for the deposition process of the organic emitting layer 240.

The cathode electrode 250 is provided on the organic emitting layer 240. Since the cathode electrode 250 is disposed in a light-emission surface, the cathode electrode 250 is formed of a transparent conductive material. According as the cathode electrode 250 is formed of the transparent conductive material, the resistance of the cathode electrode is increased. In order to lower the resistance of the cathode electrode 250, the cathode electrode 250 is connected with the auxiliary electrode 190 through the contact electrode 190a. In more detail, the cathode electrode 250 extends to the inside of the hollow space (C), and comes into contact with the upper surface of the lower contact electrode 190a. According to one embodiment of the present disclosure, the cathode electrode 250 is electrically connected with the auxiliary electrode 190 through the lower contact electrode 190a provided with the hollow space (C), whereby there is no need for the related art partition with the reversed-tapered structure. That is, there is no problem relating peel-off or collapse of the partition.

The cathode electrode 250 may be manufactured by sputtering, that is, a deposition process using a deposition material with inferior straightness. Accordingly, the cathode electrode 250 may be deposited in the hollow space (C) for the deposition process of the cathode electrode 250.

Although not shown, an encapsulation layer may be additionally provided on the cathode electrode 250 so as to prevent a permeation of moisture. The encapsulation layer may be formed of various materials generally known to those in the art. Also, although not shown, a color filter may be additionally provided on the cathode electrode 250 for each pixel. In this case, a white light may be emitted from the organic emitting layer 240.

FIGS. 3A to 3J are cross sectional views illustrating a method of manufacturing the organic light emitting display device according to one embodiment of the present disclosure, which relate to the organic light emitting display device shown in FIG. 2. Thus, the same reference numbers will be used throughout the drawings to refer to the same or like parts, and a detailed description for the same parts will be omitted.

Figure 3A:
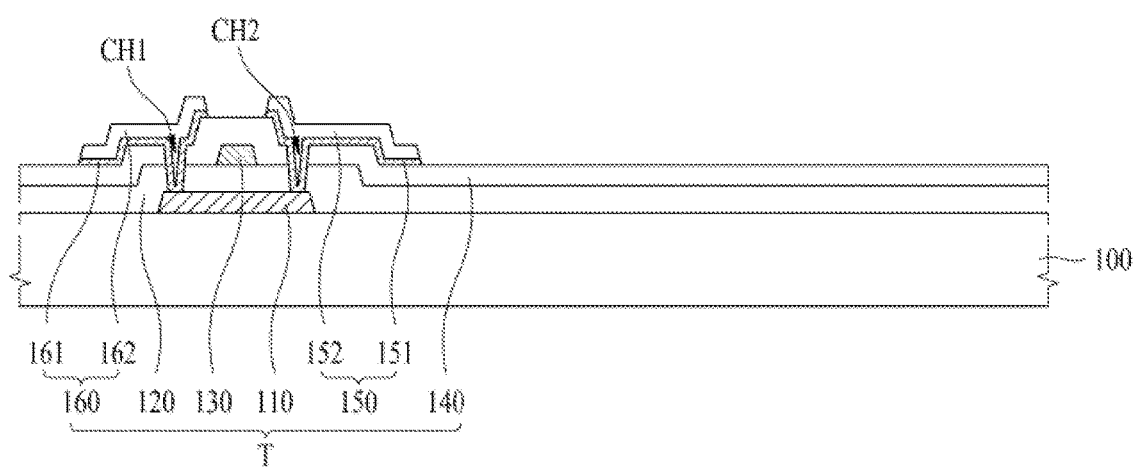
FIGS. 3A to 3J are cross sectional views illustrating a method of manufacturing the organic light emitting display device according to one embodiment of the present disclosure.

First, as shown in FIG. 3A, a thin film transistor layer (T) including an active layer 110, a gate insulating film 120, a gate electrode 130, an insulating interlayer 140, a source electrode 150 and a drain electrode 160 is provided on a substrate 100.

In more detail, the active layer 110 is provided on the substrate 100, the gate insulating film 120 is provided on the active layer 110, the gate electrode 130 is provided on the gate insulating film 120, the insulating interlayer 140 is provided on the gate electrode 130, a first contact hole (CH1) and a second contact hole (CH2) are provided in the gate insulating film 120 and the insulating interlayer 140, the drain electrode 160 which is connected with one end portion of the active layer 110 via the first contact hole (CH1) is provided and the source electrode 150 which is connected with the other end portion of the active layer 110 via the second contact hole (CH2) is provided.

The source electrode 150 includes a lower source electrode 151 and an upper source electrode 152. The drain electrode 160 includes a lower drain electrode 161 and an upper drain electrode 162. The source electrode 150 and the drain electrode 160 may be simultaneously patterned by the same material for the same process.

Figure 3B:
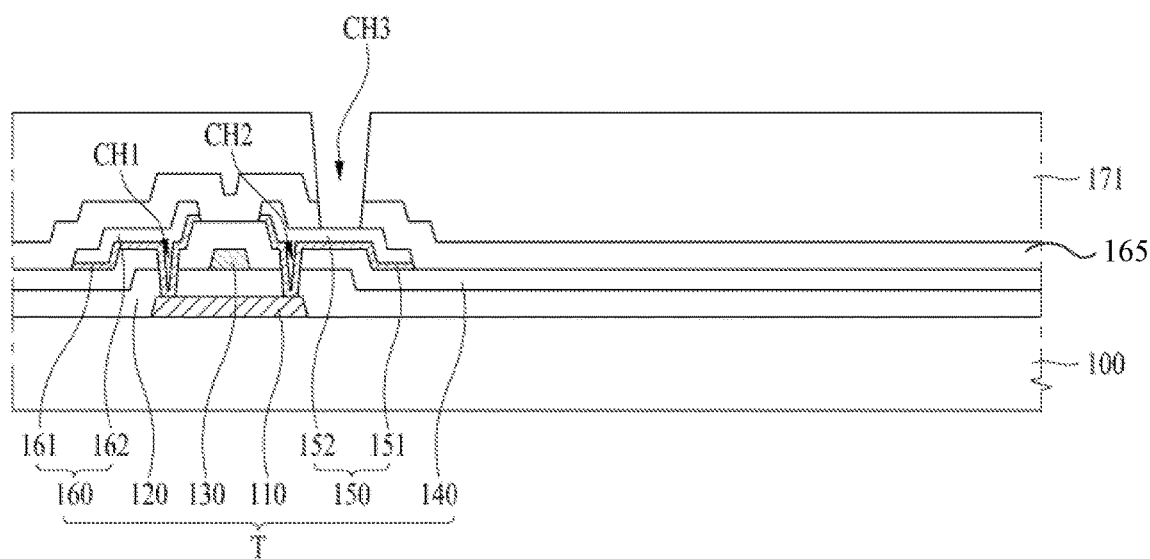

Then, as shown in FIG. 3B, a passivation layer 165 is provided on the source electrode 150 and the drain electrode 160, and a first planarization layer 171 is provided on the passivation layer 165.

The passivation layer 165 and the first planarization layer 171 are provided to include a third contact hole (CH3), wherein the source electrode 150 is exposed to the outside via the third contact hole (CH3).

Figure 3C:
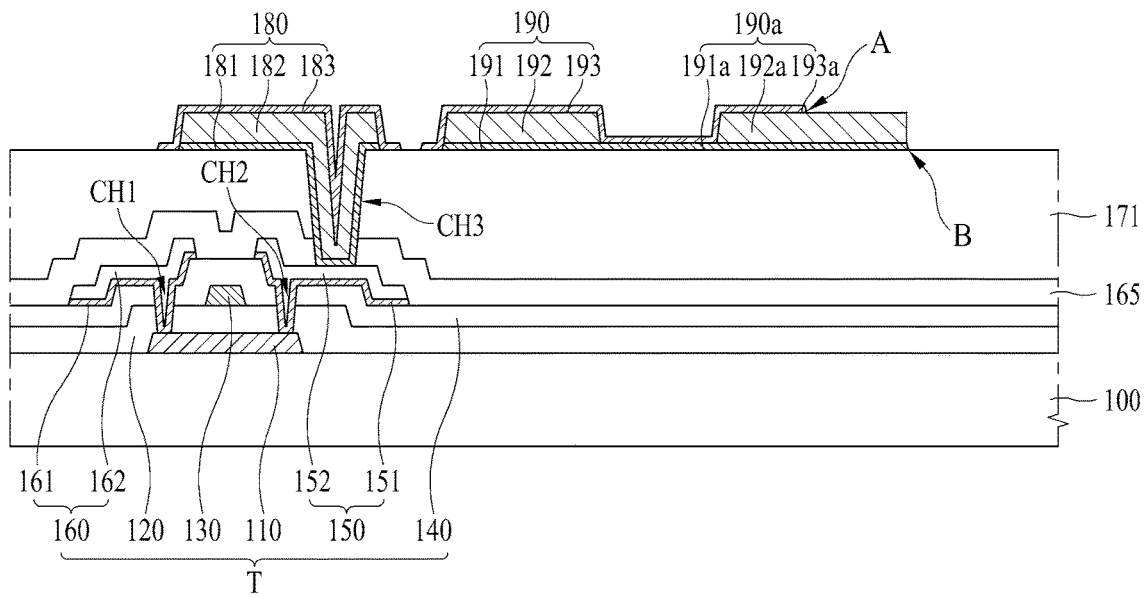

Then, as shown in FIG. 3C, a first anode electrode 180, an auxiliary electrode 190 and a contact electrode 190*a* are provided on the first planarization layer 171.

The first anode electrode 180 is connected with the source electrode 150 via the third contact hole (CH3). The first anode electrode 180 may include a first lower anode electrode 181, a first upper anode electrode 182 and a first cover anode electrode 183.

The auxiliary electrode 190 is horizontally spaced apart from the first anode electrode 180, and is connected with the contact electrode 190*a*. The auxiliary electrode 190 may include a lower auxiliary electrode 191, an upper auxiliary electrode 192 and a cover auxiliary electrode 193.

The contact electrode 190*a* is connected with the auxiliary electrode 190. The contact electrode 190*a* may include a lower contact electrode 191*a*, an upper contact electrode 192*a* and a cover contact electrode 193*a*.

The lower contact electrode 191*a* and the lower auxiliary electrode 191 are connected with each other, and are formed as one body. The cover contact electrode 193*a* and the cover auxiliary electrode 193 are connected with each other, and are formed as one body. However, the upper contact electrode 192*a* is spaced apart from the upper auxiliary electrode 192.

In this case, an end (B) of the lower contact electrode 191*a* may extend more than an end (A) of the cover contact electrode 193*a*, whereby one predetermined portion of the upper contact electrode 192*a* may be exposed. According as one predetermined portion of the upper contact electrode 192*a* is exposed, the upper contact electrode 192*a* may be removed by the etching process of FIG. 3H, and the hollow space (C) may be prepared in the region from which the upper contact electrode 192*a* is removed.

The first anode electrode 180, the auxiliary electrode 190 and the contact electrode 190*a* may be simultaneously formed by the various patterning processes, whereby there is no need for the additional process. For example, a first ITO layer is deposited on the entire surface of the first planarization layer 171; the first upper anode electrode 182, the upper auxiliary electrode 192 and the upper contact electrode 192*a* are patterned thereon; a second ITO layer is deposited on the entire surface thereof; and then first ITO layer and the second ITO layer are simultaneously patterned so as to form the first lower anode electrode 181, the lower auxiliary electrode 191 and the lower contact electrode 191*a* of the first ITO layer, and also to form the first cover anode electrode 183, the cover auxiliary electrode 193 and the cover contact electrode 193*a* of the second ITO layer. In another way, the first lower anode electrode 181, the lower auxiliary electrode 191 and the lower contact electrode 191*a* may be patterned on the first planarization layer 171; the first upper anode electrode 182, the upper auxiliary electrode 192 and the upper contact electrode 192*a* may be patterned thereon; and then the first cover anode electrode 183, the cover auxiliary electrode 193 and the cover contact electrode 193*a* may be patterned thereon.

Figure 3D:
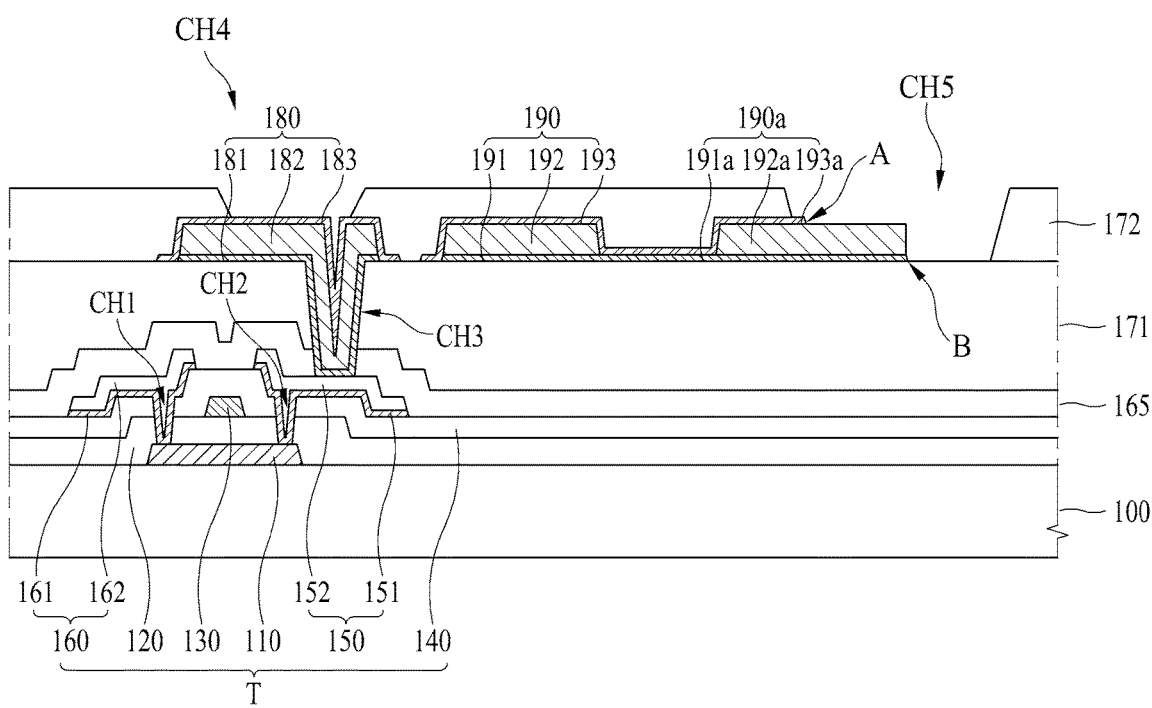

Then, as shown in FIG. 3D, the second planarization layer 172 is provided on the first anode electrode 180, the auxiliary electrode 190 and the contact electrode 190*a*.

The second planarization layer 172 is provided to include the fourth contact hole (CH4) and the fifth contact hole (CH5). The first anode electrode 180 is exposed to the outside via the fourth contact hole (CH4), and the contact electrode 190*a* is exposed to the outside via the fifth contact hole (CH5).

Figure 3E:
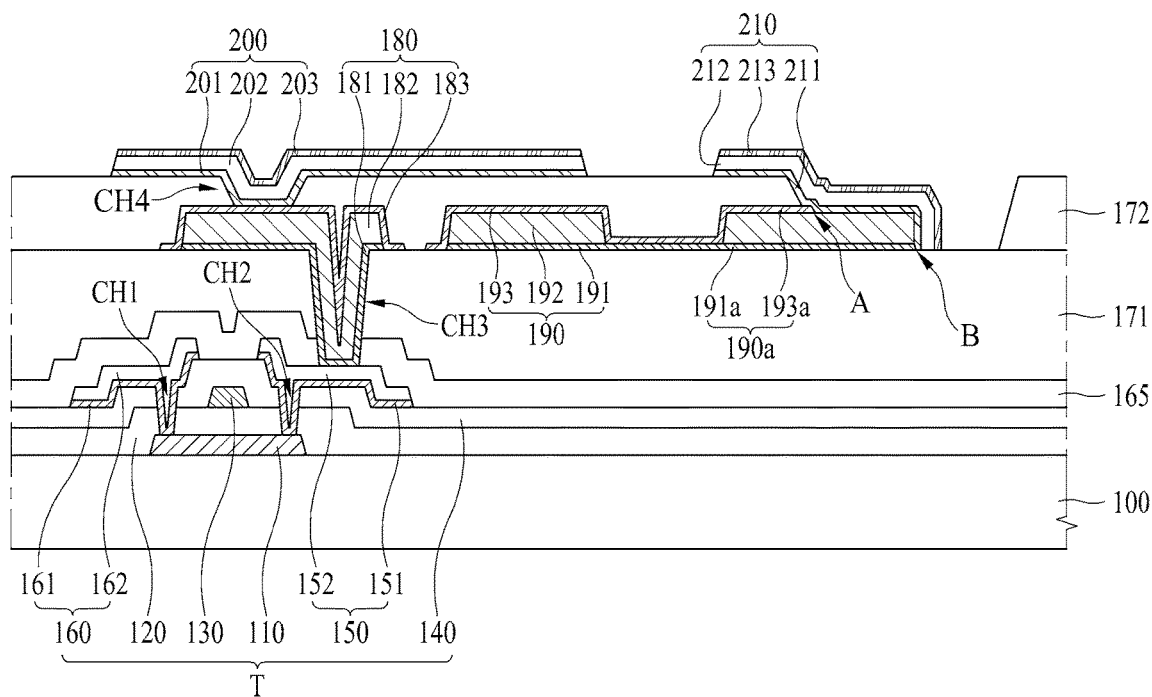

As shown in FIG. 3E, the second anode electrode 200 and the protection electrode 210 are provided on the second planarization layer 172.

The second anode electrode 200 is connected with the first anode electrode 180 via the fourth contact hole (CH4), and the protection electrode 210 is connected with the contact electrode 190*a* via the fifth contact hole (CH5). The protection electrode 210 is spaced apart from the second anode electrode 200.

The second anode electrode 200 covers all portions of the fourth contact hole (CH4). However, all portions of the fifth contact hole (CH5) are not covered by the protection electrode 210, that is, the predetermined portion of the fifth contact hole (CH5) is exposed to the outside. According to the predetermined portion of the fifth contact hole (CH5) is exposed, the bank 220 to the left of the contact hole CH5 extends to the exposed fifth contact hole (CH5) for the following process of FIG. 3F.

The second anode electrode 200 may include a second lower anode electrode 201, a second central anode electrode 202 and a second upper anode electrode 203. The protection electrode 210 may include a lower protection electrode 211, a central protection electrode 212 and an upper protection electrode 213.

The second anode electrode 200 and the protection electrode 210 may be simultaneously patterned by the same material for the same process, whereby there is no need for the additional process.

Figure 3F:
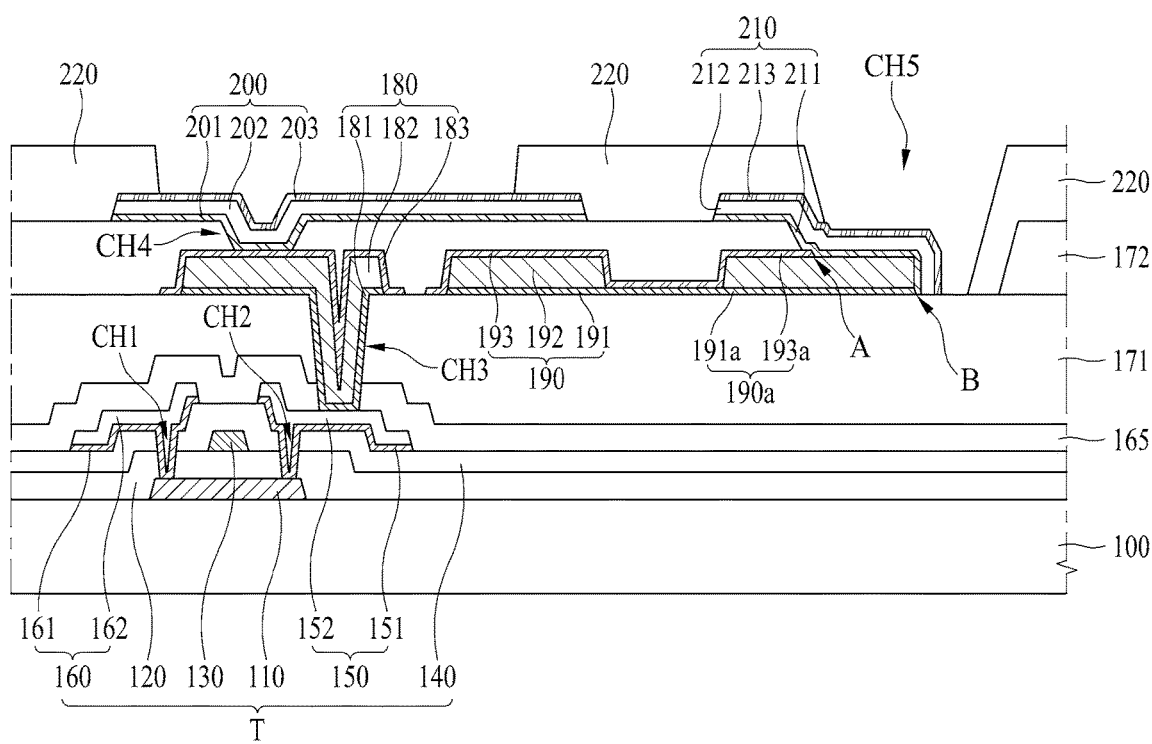

Then, as shown in FIG. 3F, the bank 220 to the left of the contact hole CH5 is provided on the second anode electrode 200 and the protection electrode 210.

The bank 220 to the left of the contact hole CH5 is patterned to expose the upper surface of the second anode electrode 200. Also, the bank 220 to the left of the contact hole CH5 is patterned to expose the predetermined portion of the protection electrode 210 in the fifth contact hole (CH5). In this case, the predetermined portion of the bank 220 to the left of the contact hole CH5 extends to the fifth contact hole (CH5) along the lateral side of the second planarization layer 172.

Figure 3G:
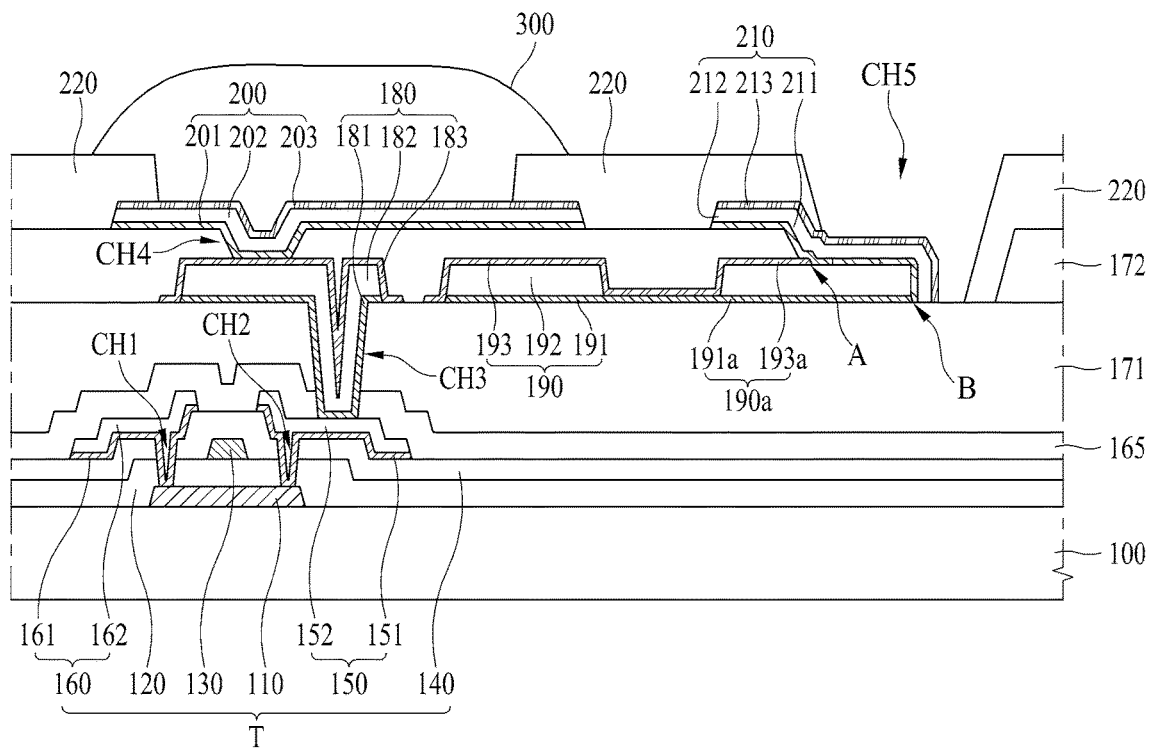

As shown in FIG. 3G, a photoresist 300 is patterned on the upper surface of the second anode electrode 200 exposed by the bank 220. Accordingly, the upper surface of the second anode electrode 200 is covered by the photoresist 300 so that it is possible to prevent the second anode electrode 200 from being etched by the process of FIG. 3H. However, the photoresist 300 is not patterned in the fifth contact hole (CH5), whereby the predetermined portion of the protection electrode 210 is exposed to the outside.

Figure 3H:
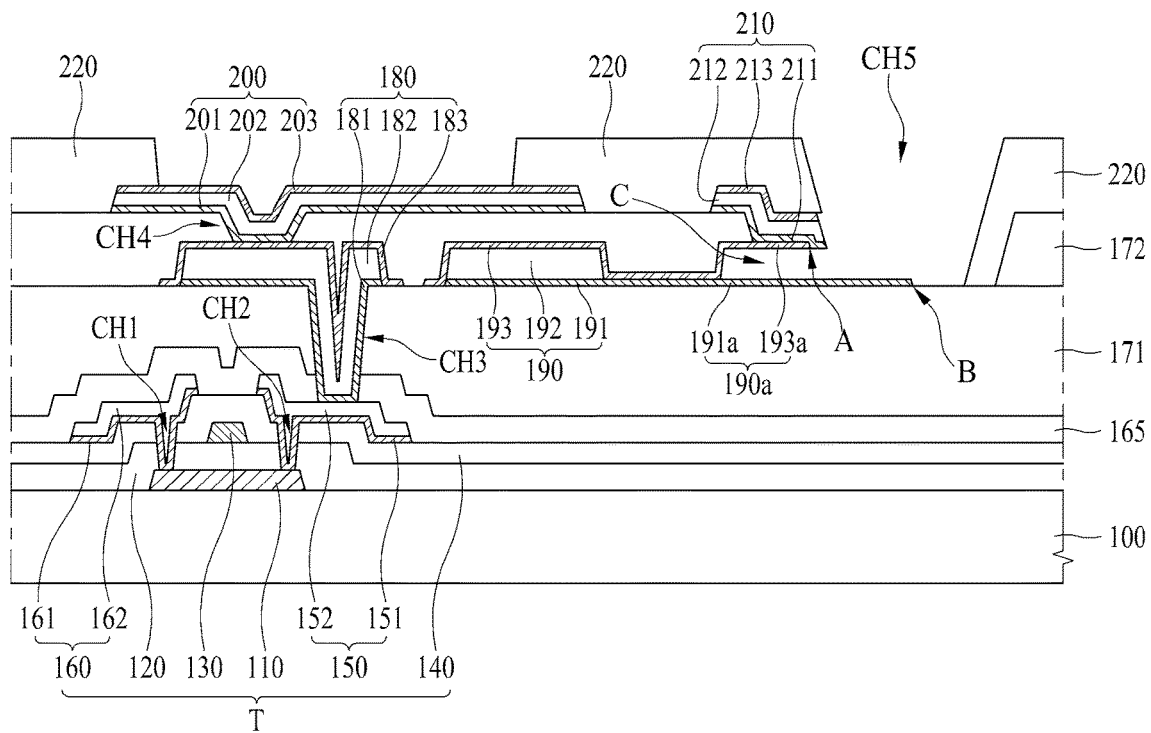

Then, as shown in FIG. 3H, the predetermined portion of the protection electrode 210, which is not covered by the photoresist 300, is removed, and the upper contact electrode 192a is also removed at the same time. Accordingly, it is possible to completely form the contact electrode 190a comprising the lower contact electrode 191a and the cover contact electrode 193a and to prepare the hollow space (C) between the lower contact electrode 191a and the cover contact electrode 193a. That is, the hollow space (C) is prepared in the region from which the upper contact electrode 192a is removed.

If the lower contact electrode 191a and the cover contact electrode 193a are formed of indium-tin-oxide (ITO), and the lower protection electrode 211 and the upper protection electrode 213 are formed of indium-zinc-oxide (IZO), the indium-tin-oxide (ITO) is crystallized for a high temperature curing process of forming the bank 200 and is changed to crystalline ITO, however, the indium-zinc-oxide (IZO) is not crystallized and remains as amorphous IZO due to a high crystalline temperature. Thus, for the etching process of FIG. 3H, the lower protection electrode 211 and the upper protection electrode 213 of the amorphous IZO may be etched, however, the lower contact electrode 191a and the cover contact electrode 193a of the crystalline ITO may remain without being etched. According as only the upper contact electrode 192a is removed by the etching process, the hollow space (C) is prepared between the lower contact electrode 191a and the cover contact electrode 193a.

Figure 3I:
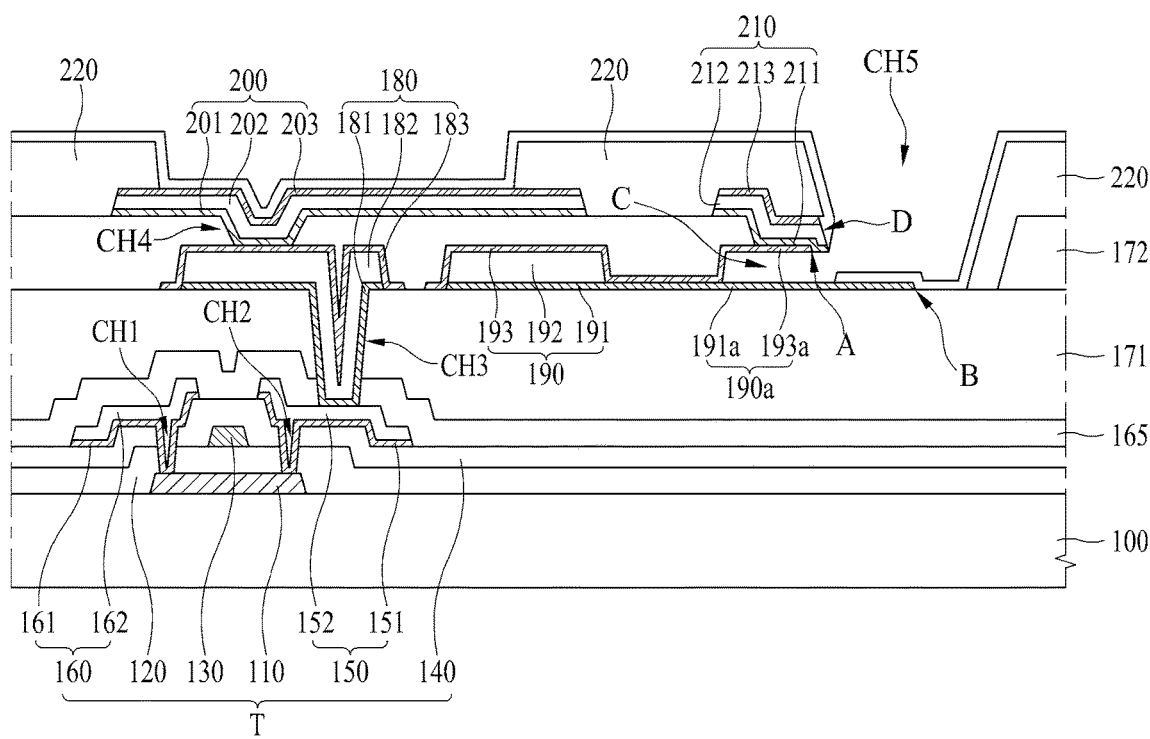

Then, as shown in FIG. 3I, the organic emitting layer 240 is provided on the second anode electrode 200. The organic emitting layer 240 may be manufactured by a deposition process using a deposition material with superior straightness, for example, evaporation. Thus, the organic emitting layer 240 is deposited on the upper surface of the bank 220, and the predetermined portion of the upper surface of the lower contact electrode 191a in the fifth contact hole (CH5). However, the organic emitting layer 240 is not deposited in the hollow space (C). That is, for the deposition process of the organic emitting layer 240, the bank 220 serves as the eaves so that it is possible to prevent the organic emitting layer 240 from being deposited in the hollow space (C). As a result, the organic emitting layer 240 is provided to expose the upper surface of the lower contact electrode 191a positioned in the hollow space (C).

Figure 3J:
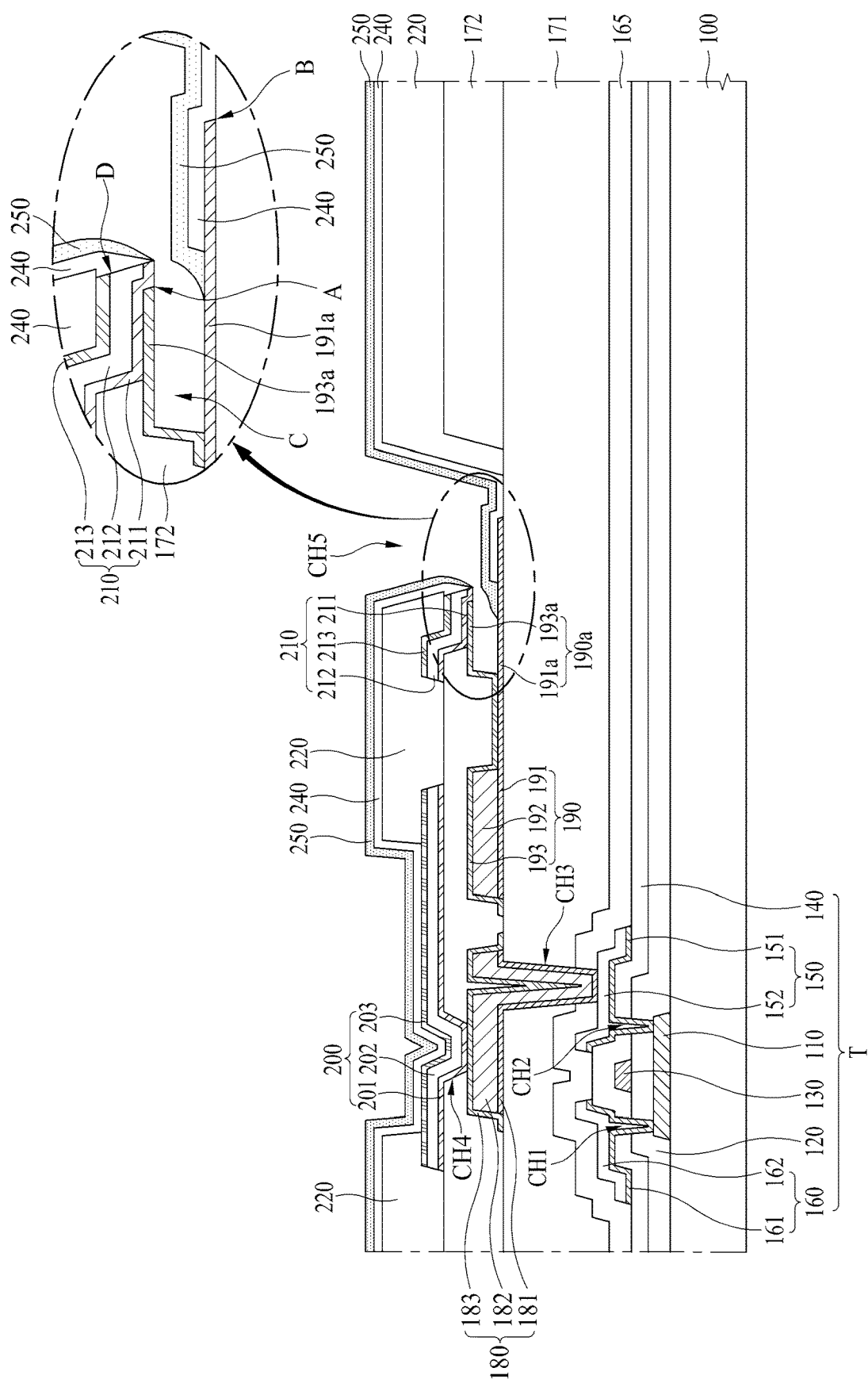

Then, as shown in FIG. 3J, the cathode electrode 250 is provided on the organic emitting layer 240.

According as the cathode electrode 250 formed on the bank 220 located to the right of the contact hole CH5 is connected with the contact electrode 190a in the hollow space (C), the cathode electrode 250 is electrically connected with the auxiliary electrode 190.

The cathode electrode 240 may be manufactured by a deposition process using a deposition material with inferior straightness, for example sputtering. Thus, the cathode electrode 250 may be deposited in the hollow space (C). As a result, the cathode electrode 250 is connected with the lower contact electrode 190a in the hollow space (C).

The aforementioned description of the embodiments of the present invention shows the top emission type organic light emitting display device. However, the top emission type organic light emitting display device may be changed in various types within a range enabling the technical properties of the present invention. For example, a light emission may be made in the entire area of the pixel region, or a light emission may be made only in predetermined portions of the pixel region. That is, if the light emission is made in the entire are of the pixel region, a plurality of pixels for the light emission are arranged in the entire pixel region. Meanwhile, if the light emission is made only in predetermined portions of the pixel region, pixels for the light emission are arranged only in the predetermined portions of the pixel region, and the pixels for the light emission are not arranged in the remaining portions, to thereby configure a transparent organic light emitting display device. In case of the transparent organic light emitting display device, the aforementioned transistor (T), the first anode electrode 180, the second anode electrode 200, the auxiliary electrode 190, the contact electrode 190a, the protection electrode 210 and the organic emitting layer 240 are not provided in the pixel region where the light emission is not made, but not limited to this structure.

According to the present invention, the cathode electrode 250 is electrically connected with the auxiliary electrode 190 by the additional contact electrode 190a, whereby there is no need for the partition having the reversed tapered structure. Thus, there is no problem relating peel-off or collapse of the partition.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing an organic light emitting display device comprising:
   forming a contact electrode over a substrate, the contact electrode including a first contact electrode, a second contact electrode on the first contact electrode, and a third contact electrode on the second contact electrode, the first contact electrode formed with an end that horizontally extends past an end of the third contact electrode;
   forming a planarization layer over the contact electrode, the planarization layer including a contact hole that exposes the contact electrode;
   forming a protection electrode on the planarization layer, the protection electrode connected to the contact electrode via the contact hole in the planarization layer;
   forming a bank that overlaps a portion of the protection electrode, a portion of the first contact electrode, a portion of the second contact electrode, and the end of the third contact electrode;
   etching a portion of the protection electrode and a portion of the second contact electrode that are not overlapped by the bank to create a hollow space between the portion of the third contact electrode and the portion of the first contact electrode that are overlapped by the bank; and
   forming a cathode electrode which extends to the hollow space and is connected to the first contact electrode at the hollow space.

2. The method according to claim 1, further comprising:
   simultaneously forming an auxiliary electrode that is connected with the contact electrode and a first anode electrode in a same layer, the auxiliary electrode horizontally spaced apart from the first anode electrode,
   wherein the contact electrode is simultaneously formed with the auxiliary electrode and the first anode electrode.

3. The method according to claim 1, further comprising:
   forming a second anode electrode that is connected with the first anode electrode, wherein a portion of the second anode electrode is formed in a different layer than the first anode electrode, wherein the second anode electrode and the protection electrode are simultaneously formed in a same layer.

4. The method according to claim 3, further comprising: covering the second anode electrode with a mask before etching the portion of the protection electrode and the portion of the second contact electrode that is not overlapped by the bank.

5. The method according to claim 1, wherein etching comprises:
using an etchant to simultaneously remove the portion of the protection electrode and the portion of the second contact electrode that are not overlapped by the bank.

* * * * *